(12) United States Patent
Harvest

(10) Patent No.: US 9,448,272 B2
(45) Date of Patent: Sep. 20, 2016

(54) EARTHED CONNECTION DETECTION

(71) Applicant: Danfoss A/S, Nordborg (DK)

(72) Inventor: Nils-Ole Harvest, Nordborg (DK)

(73) Assignee: Danfoss A/S, Nordborg (DK)

( * ) Notice: Subject to any disclaimer, the term of this patent is extended or adjusted under 35 U.S.C. 154(b) by 132 days.

(21) Appl. No.: 14/352,349

(22) PCT Filed: Oct. 23, 2012

(86) PCT No.: PCT/DK2012/000116
§ 371 (c)(1),
(2) Date: Apr. 17, 2014

(87) PCT Pub. No.: WO2013/068010
PCT Pub. Date: May 16, 2013

(65) Prior Publication Data
US 2014/0266236 A1 Sep. 18, 2014

(30) Foreign Application Priority Data
Nov. 9, 2011 (DK) .................................. 2011 00873

(51) Int. Cl.
*G01R 31/14* (2006.01)
*G01R 31/02* (2006.01)
*G01R 27/20* (2006.01)
*G01R 27/18* (2006.01)

(52) U.S. Cl.
CPC ............. *G01R 31/025* (2013.01); *G01R 27/20* (2013.01); *G01R 27/205* (2013.01); *G01R 27/18* (2013.01)

(58) Field of Classification Search
CPC .. G01R 31/025; G01R 27/205; G01R 27/20; G01R 27/18

USPC ................................. 324/510, 509, 512, 528
See application file for complete search history.

(56) References Cited

U.S. PATENT DOCUMENTS 3,895,264 A    7/1975  Kirilloff
4,995,014 A *  2/1991  Hoornstra .............. G01H 11/08
                                                    367/153

(Continued)

FOREIGN PATENT DOCUMENTS

CN    2071791 U    2/1991
CN    2757143 Y    2/2006

(Continued)

OTHER PUBLICATIONS

International Search Report for PCT Serial No. PCT/DK2012/000116 dated Mar. 27, 2013.
Danish Search Report Serial No. PA201100873 dated May 10, 2012.

(Continued)

*Primary Examiner* — Amy He
(74) *Attorney, Agent, or Firm* — McCormick, Paulding & Huber, LLP

(57) ABSTRACT

A mechanism is described for determining whether or not a ground connection is properly earthed by determining whether or not a potential difference exists between a voltage measuring point and a ground connection. A first capacitor is connected between the ground connection and a first power line and a first duplicating capacitor (having the same capacitance as the first capacitor) is connected between the voltage measuring point and the first power line. If the determining step determines that the potential difference does not exist, then it is determined that the ground connection is not properly earthed.

19 Claims, 4 Drawing Sheets

(56) References Cited

U.S. PATENT DOCUMENTS

| | | | |
|---|---|---|---|
| 5,181,026 A * | 1/1993 | Granville | G01R 15/183 324/96 |
| 5,739,999 A * | 4/1998 | Gruber | H02H 9/026 361/106 |
| 5,808,470 A * | 9/1998 | Adams, III | G01R 31/025 324/509 |
| 6,025,980 A * | 2/2000 | Morron | H02H 1/04 361/115 |
| 6,456,085 B1 * | 9/2002 | Dietl | B60L 3/0069 324/509 |
| 8,018,274 B1 * | 9/2011 | Bales | H03F 3/005 327/124 |
| 2007/0159184 A1 | 7/2007 | Reynolds et al. | |
| 2007/0268636 A1 * | 11/2007 | Suzuki | G01R 31/025 361/48 |
| 2008/0136403 A1 * | 6/2008 | Deck | G01R 15/181 324/110 |
| 2008/0283876 A1 | 11/2008 | Souda | |
| 2009/0045818 A1 | 2/2009 | Male | |
| 2009/0121805 A1 * | 5/2009 | Tucker | H02M 1/12 333/167 |
| 2010/0244760 A1 | 9/2010 | Anwar et al. | |

FOREIGN PATENT DOCUMENTS

| | | |
|---|---|---|
| CN | 101165505 A | 4/2008 |
| DE | 939462 C | 5/1956 |
| EP | 0778467 A2 | 6/1997 |
| EP | 1 860 445 A1 | 11/2007 |
| EP | 2 230 529 A1 | 9/2010 |
| GB | 2 087 084 A | 5/1982 |
| JP | 2007-309907 A | 11/2007 |
| SU | 854249 A1 | 5/1992 |
| WO | 01/55738 A2 | 8/2001 |

OTHER PUBLICATIONS

Chinese Office Action dated Oct. 9, 2015 for Chinese Patent Application No. 201280053332.5 and its English Translation.

* cited by examiner

EARTHED CONNECTION DETECTION

CROSS REFERENCE TO RELATED APPLICATIONS

This application is entitled to the benefit of and incorporates by reference subject matter disclosed in International Patent Application No. PCT/DK2012/000116 filed on Oct. 23, 2012 and Danish Patent Application No. PA 2011 00873 filed Nov. 9, 2011.

FIELD OF THE INVENTION

The present invention relates to the detection of the absence of an earthed connection in electrical and electronic circuits.

BACKGROUND

Ground or earth connections are used in electrical circuits for a wide variety of purposes. Earth or ground connections provide a potential against which other potentials can be referenced. Earth or ground connections also have safety functions, for example for preventing the build up of static electricity and for preventing persons getting electric shock in case of insulation failure. Furthermore, ground connections are often necessary for the correct function of an EMC filter in an electric circuit.

In the context of electrical engineering, the terms "ground" and "earth" typically have the same meaning. The terms are used interchangeably in this document.

In many circumstances, electrical circuits will function regardless of whether a ground or earth connection of the circuit is correctly attached to ground/earth. However, such circuits may be potentially unsafe to a user. Alternatively, or in addition, such circuits may be vulnerable to damage, for example due to transient overvoltage on the mains supply e.g. caused by lightning.

SUMMARY

The present invention seeks to address at least some of the problems outlined above.

The present invention provides a circuit comprising: a first capacitor connected between a first power line and a ground connection; a first duplicating capacitor having a capacitance equal to said first capacitor, wherein the first duplicating capacitor is connected between the first power line and a measuring point; and a comparison circuit for determining whether or not a potential difference exists between the measuring point and the ground connection.

The existence of a potential difference indicates that the ground connection is reliably connected to earth. The absence of a potential difference indicates that the ground connection is not connected to earth.

The circuit may further comprise: a second capacitor connected between a second power line and the ground connection; and a second duplicating capacitor having a capacitance equal to said second capacitor, wherein the second duplicating capacitor is connected between the second power line and the measuring point.

The circuit may further comprise: an additional impedance connected between the first power line and the ground connection; and a duplicating additional impedance having an impedance equal to said additional impedance, wherein the duplicating additional impedance is connected between the first power line and the measuring point. The additional impedance could, for example, be capacitive, resistive, inductive or a combination thereof. An additional impedance could be provided between the second power rail and ground (either instead of, or as well as, the additional impedance provided between the first power rail and ground) with a duplicating additional impedance being provided between the second power rail and the measuring point.

A third capacitor may be provided that is connected between a part of the circuit and the ground connection. A third duplicating capacitor having a capacitance equal to said third capacitor may then be provided between said part of the circuit and the measuring point. In one form of the invention, a first resistor is coupled in series with the third capacitor between said part of the circuit and the ground connection and a first duplicating resistor is coupled in series with the third duplicating capacitor between said part of the circuit and the measuring point.

A first impedance may be connected between a part of the circuit and the ground connection and a duplicating impedance having an impedance equal to said first impedance may be connected between said part of the circuit and the measuring point. The first impedance could, for example, be capacitive, resistive, inductive or a combination thereof.

Clearly, more capacitors could be connected between either power rail and the ground connection, with those capacitors being duplicated. Also, more capacitors could be connected between difference parts of the circuit, with those capacitors being duplicated. Other impedances can also be provided, with those impedances being duplicated.

The first power line or the second power line may be a live power rail. The first or the second power rail may be a neutral power rail. Other configurations (for example, suitable for US terminology) are also possible.

A fourth capacitor may be provided between a third power line and the ground connection. A fourth duplicating capacitor may be connected between the third power line and the measuring point.

The circuit of the present invention may, for example, be an electromagnetic compatibility (EMC) filter.

The comparison circuit may be (or may include) a differential amplifier. For example, a low pass differential amplifier may be provided. The comparison circuit may comprise a comparator.

The circuit of the present invention may additionally provide an output for indicating whether or not the ground connection is properly earthed.

The capacitors might typically have a capacitance of the order of 10 nF. Note that not all of the capacitors need have the same capacitance (although of course each duplicating capacitor should have the same capacitance as the capacitor that it is duplicating).

The present invention also provides a method comprising: comparing voltage potentials at a measuring point and a ground connection, wherein a first capacitor is connected between the ground connection and a first power line and wherein a first duplicating capacitor is connected between the measuring point and the first power line, the first capacitor and the first duplicating capacitor having the same capacitance; and providing a signal indicating whether or not a potential difference exists between a measuring point (typically a voltage measuring point) and a ground connection.

The existence of a potential difference indicates that the ground connection is reliably connected to earth. The absence of a potential difference indicates that the ground connection is not connected to earth. Accordingly, the signal may be used as an output indicating whether or not the ground connection is earthed.

A second capacitor may be connected between a second power line and the ground connection and a second duplicating capacitor having a capacitance equal to said second capacitor may be connected between the second power rail and the (voltage) measuring point.

A first impedance may be connected between a part of the circuit and the ground connection and a duplicating impedance having an impedance equal to said first impedance may be connected between said part of the circuit and the measuring point. The impedance may take the form of a capacitance, but other forms of impedance (e.g. capacitance, resistance and/or inductance) are possible. In one form of the invention, the impedance comprises a capacitance and a resistance connected in series.

An additional impedance may be connected between the first power line and the ground connection and a duplicating additional impedance having an impedance equal to said additional impedance may be connected between the first power line and the measuring point. The additional impedance could be capacitive, resistive, inductive or a combination thereof. A further additional impedance could be provided between the second power rail and ground.

BRIEF DESCRIPTION OF THE DRAWINGS

The invention will now be described in further detail with reference to the following schematic drawings, in which.

DETAILED DESCRIPTION

The use of capacitors for mains filtering is well known. Mains filtering may be required, for example, to ensure that a circuit meets electromagnetic interference (EMI) requirements.

Figure 1:
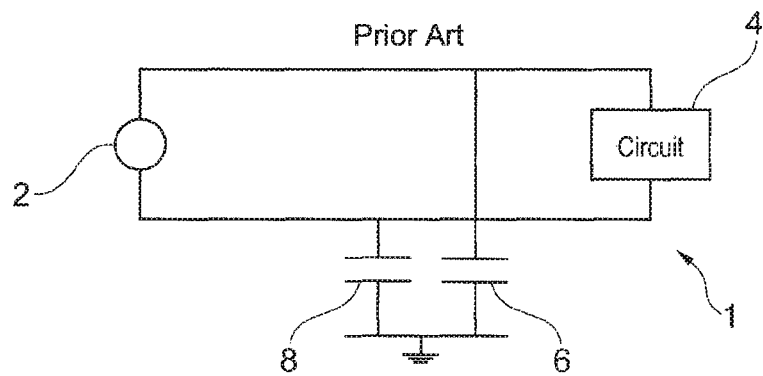
FIG. 1 is a circuit diagram of a known filter arrangement.

FIG. 1 shows a known filter arrangement, indicated generally by the reference numeral 1. The filter 1 comprises an AC voltage source 2 (such as a mains voltage source) and a circuit 4. As shown, the AC voltage source 2 has a first terminal and a second terminal. A first capacitor 6 is connected between the first terminal and a ground (or earth) connection. A second capacitor 8 is connected between the second terminal and the ground/earth connection. The filter capacitors 6 and 8 are used to filter mains noise in a manner well known in the art.

The inventor has realised that the existing filtering arrangement shown in FIG. 1 can be exploited to determine whether or not the ground connection is properly connected to earth.

Figure 2:
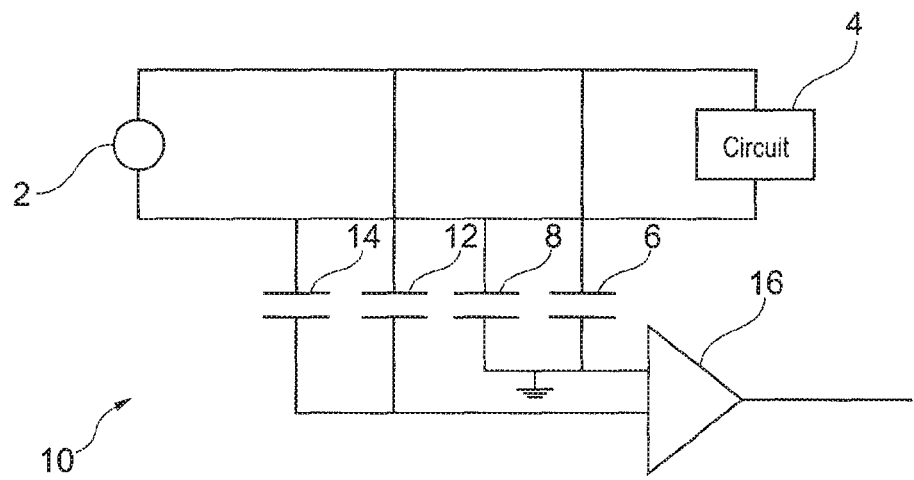
FIG. 2 shows a circuit in accordance with an aspect of the present invention.

FIG. 2 is a schematic circuit diagram, indicated generally by the reference numeral 10, in accordance with an aspect of the present invention. The circuit 10 comprises the AC voltage source 2, circuit 4, first capacitor 6 and second capacitor 8 of the filter 1 described above. The circuit 10 additionally includes a first duplicating capacitor 12, a second duplicating capacitor 14 and a comparison circuit 16.

The first duplicating capacitor 12 is connected between the first terminal of the AC voltage source 2 and a first terminal of the comparison circuit 16. The second duplicating capacitor 14 is connected between the second terminal of the AC voltage source 2 and the first terminal of the comparison circuit 16. A second terminal of the comparison circuit 16 is connected to ground (and hence to the second terminals of the first and second capacitors).

The first duplicating capacitor 12 matches the first capacitor 6. Similarly, the second duplicating capacitor 14 matches the second capacitor 8. Typically, the first capacitor 6 will have a capacitance perhaps of the order of 10 nF. If so, then the first duplicating capacitor would also have a capacitance of 10 nF. The second capacitor 8 and the second duplicating capacitor might also have capacitances of the order of 10 nF. Of course, other capacitance values are possible and the first and second capacitors 6 and 8 could have difference capacitances.

The comparison circuit 16 is used to determine whether a potential difference occurs between the two inputs to the comparison circuit.

The second terminals of the first and second duplicating capacitors are able to change voltage, for example in response to stimuli from the voltage source 2 or the circuit 4. Thus, the voltage at the first input to the comparison device 16 will vary over time.

If properly earthed, the second input to the comparison device 16 will remain constant (at the ground potential). Thus, the potentials at the first and second inputs to the comparison device 16 will be different. However, if the ground connection to which the first and second capacitors are connected is not properly earthed, then the potential at the second input to the comparison circuit 16 is free to vary in the same way as the potential at the first input to the comparison circuit. Since the first and second duplicating capacitors match the first and second capacitors, then in the absence of a ground connection, the potential at the first input to the comparison device will vary in the same way as the potential at the second input to the comparison device.

It follows that the existence of a potential difference between the first and second inputs of the comparison device 16 indicates that the ground connection is properly earthed and the absence of a potential difference indicates that the ground connection is not properly earthed.

Figure 3:
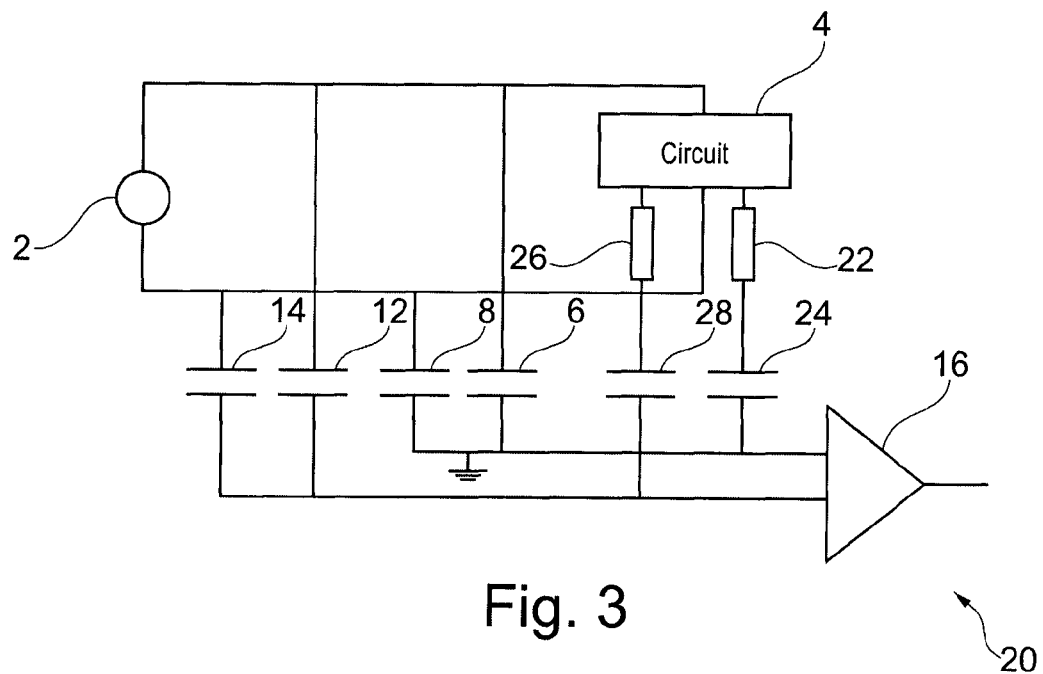
FIG. 3 shows a circuit in accordance with an aspect of the present invention.

FIG. 3 is a circuit diagram, indicated generally by the reference numeral 20, of a further aspect of the present invention. The circuit 20 comprises the voltage source 2, circuit 4, first capacitor 6, second capacitor 8, first duplicating capacitor 12, second duplicating capacitor 14 and comparison circuit 16 of the circuit 10.

The circuit 20 also includes a first resistor 22, a third capacitor 24, a first duplicating resistor 26 and a third duplicating capacitor 28. The first resistor 22 and the third capacitor 24 are connected in series between the circuit 4 and the ground connection and may be provided, for example, in order to filter electromagnetic noise from the circuit 4.

The first duplicating resistor 26 and the third duplicating capacitor 28 are connected in series between the circuit 4 and the first terminal of the comparison circuit 16.

The first duplicating resistor 26 is selected to match the first resistor 22 and the third duplicating capacitor 28 is selected to match the third capacitor 24. Accordingly, a difference in voltage between the first and second inputs of the comparison circuit 16 will still be indicative of a proper ground connection and the same voltage appearing between the first and second inputs of the comparison circuit 16 will still be indicative of a missing ground connection.

Figure 4:
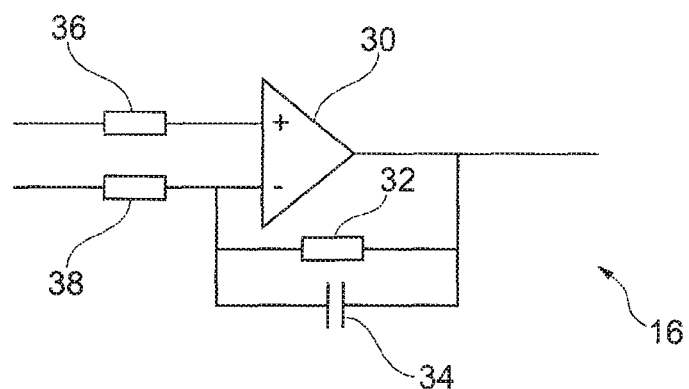
FIG. 4 is a circuit diagram of an exemplary comparison circuit for use with the present invention.

The comparison circuit 16 may take many different forms. FIG. 4 shows an exemplary comparison circuit 16, but many alternatives will be apparent to those skilled in the art. The comparison circuit 16 shown in FIG. 4 comprises an operational amplifier 30 (or some other differential amplifier), a first resistor 32, a capacitor 34, a second resistor 36 and a third resistor 38.

The first resistor 32 and the capacitor 34 of the comparison circuit 16 are connected in parallel and each have a first terminal connected to the inverting input of the operational amplifier 30 and a second terminal connected to the output of the operational amplifier. The second resistor 36 of the comparison circuit is connected between the ground connection (and hence the second terminals of the first and second capacitors) and the non-inverting input of the operational amplifier 30. The third resistor 38 of the comparison circuit is connected between the second terminal of the first and second duplicating capacitors and the inverting input of the operational amplifier.

The circuit 16 provides a simple active low-pass filter. The output of the circuit 16 is therefore related to the difference between the voltages at the input, but high frequency components are removed.

Figure 5:
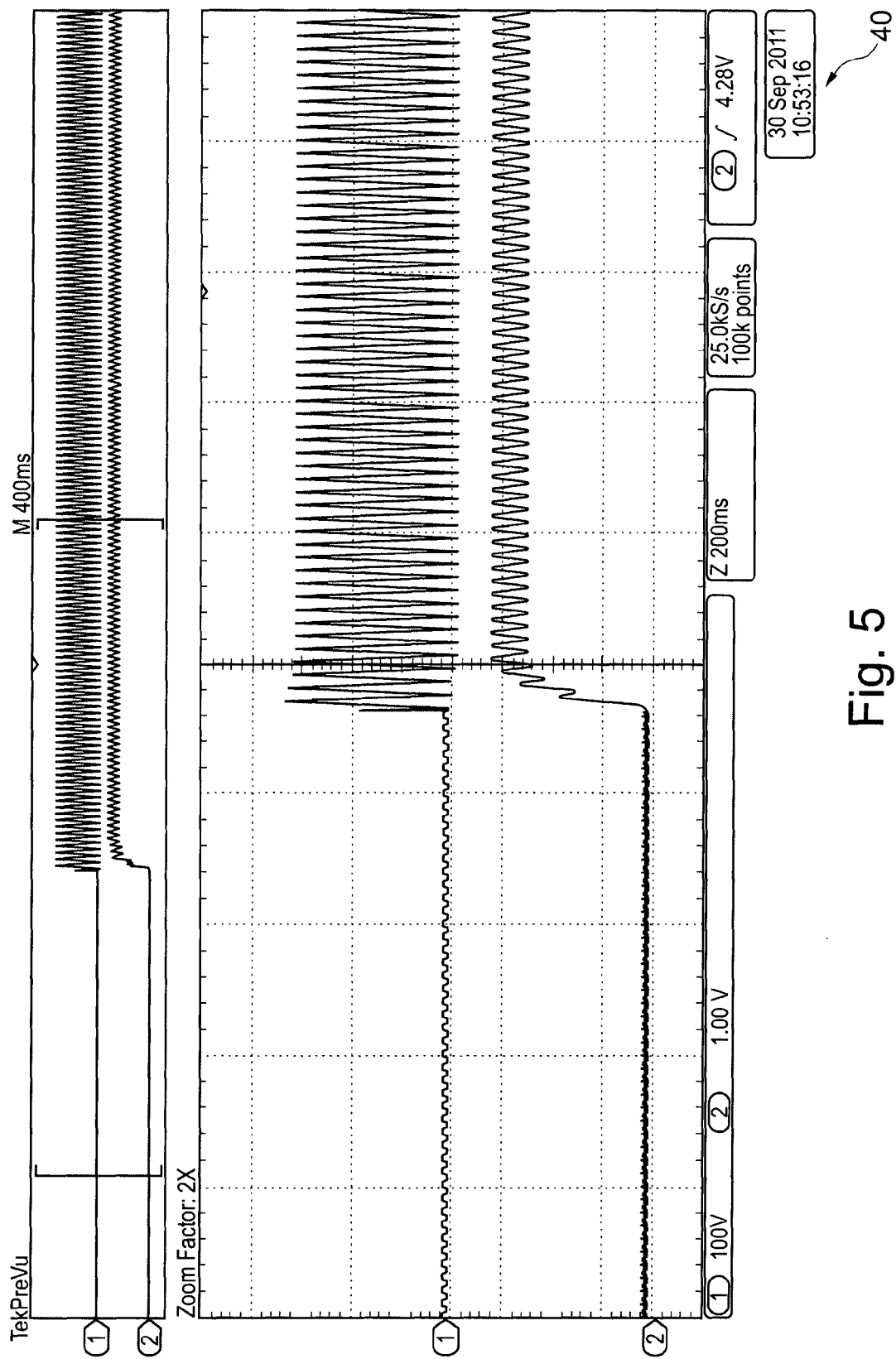
FIG. 5 shows results of a test of the operation of the circuit of FIG. 3.

FIG. 5 shows results, indicated generally by the reference numeral 40, of a test of the operation of the circuit of FIG. 3. The display shows two pairs of output waveforms, with the lower part of the figure being a zoomed version of the upper part of the figure.

The first waveform shows the potential difference between the two inputs of the comparison circuit 16. The second waveform shows the voltage at the output of the comparison circuit 16.

Initially, the ground connection is not earthed. As described above, without an earthed ground connection, the circuit providing the voltage to the first input of the comparison circuit is identical to the circuit providing the voltage to the second input of the comparison circuit. Thus, there should be no potential difference across the inputs to the comparison circuit 16.

After a period of time, the ground connection is properly earthed. Thus, the second input of the comparison circuit is grounded but the first input is free to change. This is shown in FIG. 5, where the first plot changes from a voltage of approximately zero to a voltage having a varying voltage that has a frequency equal to the frequency of the AC voltage source 2.

The output of the comparison circuit 16 is low (0 volts) when the ground connection is missing (since there is no potential difference between the inputs of the comparison device 16). When the ground connection is provided, the comparison circuit voltage increases. The test results 40 show that the presence or absence of the ground connection can be determined.

Figure 6:
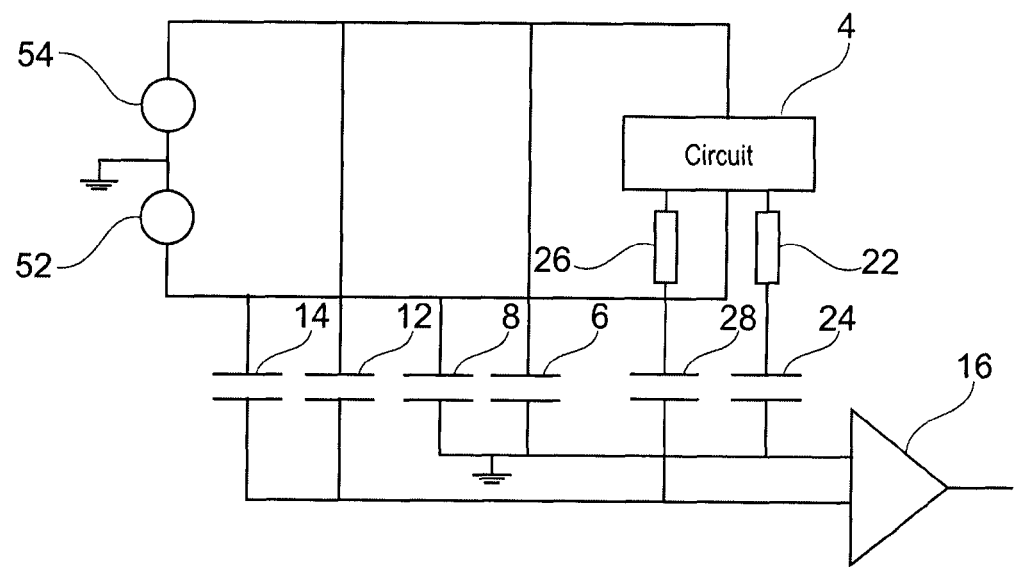
FIG. 6 shows a circuit in accordance with an aspect of the present invention.

The circuit 20 described above with reference to FIG. 3 for which test results were described above with reference to FIG. 5 uses a European-style AC mains supply. FIG. 6 shows a circuit, indicated generally by the reference numeral 50, of a similar circuit that is provided with a US-style mains supply.

The circuit 50 includes the circuit 4, the first, second and third capacitors 6, 8 and 24, the first, second and third duplicating capacitors 12, 14 and 28, the first resistor 22, the first duplicating resistor 26, and the comparison circuit 16 of the circuit 20 described above. The circuit 50 differs from the circuit 20 in that the AC power source 2 is replaced with a first AC source 52 and a second AC source 54 connected in series, with the mid-point of those AC sources being connected to ground. The two AC sources of the circuit 50 are provided to model a US-style mains supply.

Figure 7:
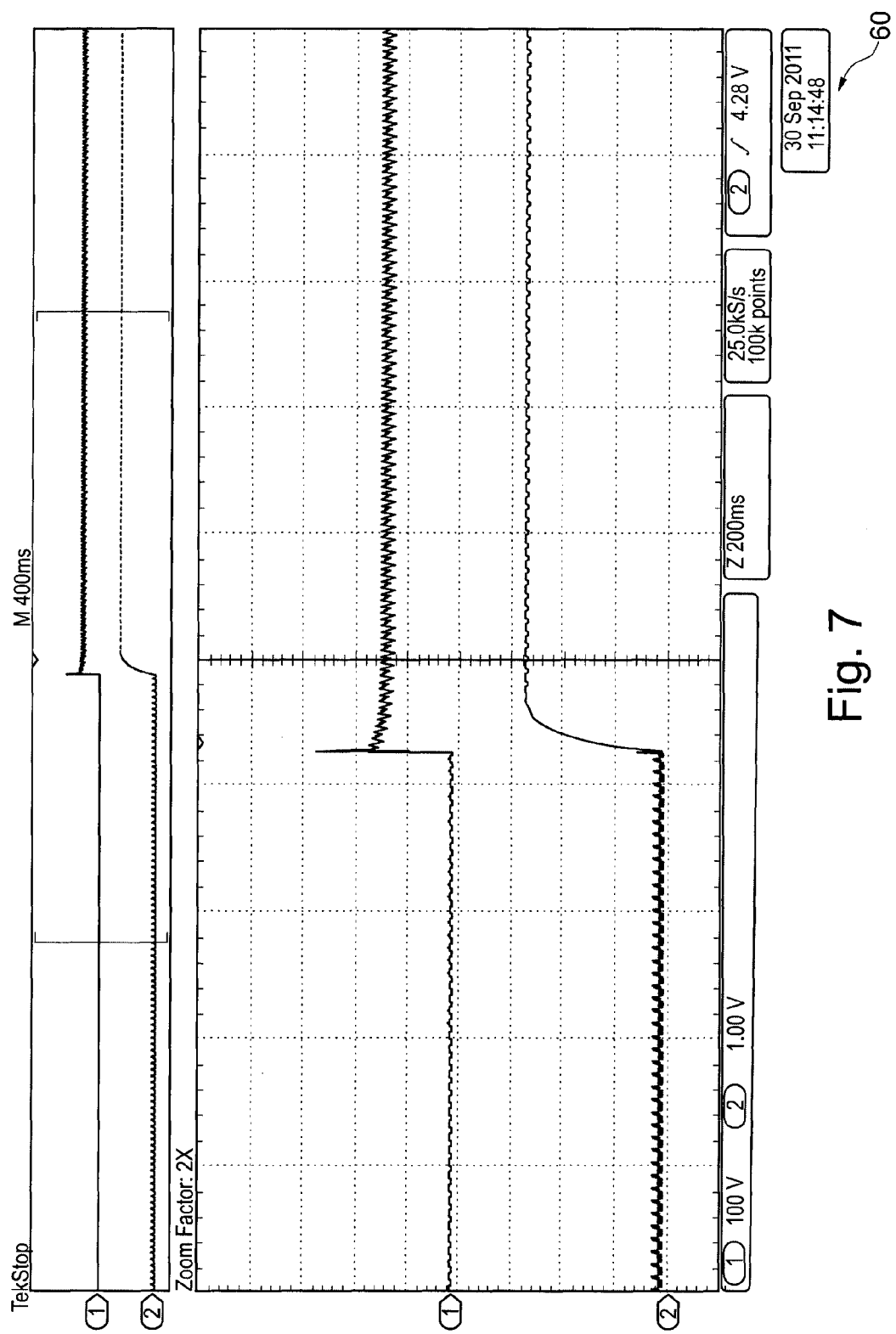
FIG. 7 shows results of a test of the operation of the circuit of FIG. 6.

FIG. 7 shows results, indicated generally by the reference numeral 60, of a test of the operation of the circuit of FIG. 6. The display shows two pairs of output waveforms, with the lower part of the figure being a zoomed version of the upper part of the figure.

The first waveform shows the potential difference between the two inputs of the comparison circuit 16. The second waveform shows the voltage at the output of the comparison circuit 16.

Initially, the ground connection is not earthed. As described above, without an earthed ground connection, the circuit providing the voltage to the first input of the comparison circuit is identical to the circuit providing the voltage to the second input of the comparison circuit. Thus, there should be no potential difference across the inputs to the comparison circuit 16. When the ground connection is earthed, the second input of the comparison circuit is grounded but the first input is free to change. This is shown in FIG. 7, where the first plot changes from a voltage of approximately zero to a voltage having a varying voltage that has a frequency equal to the frequency of the AC voltage sources 52 and 54.

The output of the comparison circuit 16 is low (0 volts) when the ground connection is missing. When the ground connection is provided, the comparison circuit voltage increases. The test results 60 show that the presence or absence of the ground connection can be determined.

Embodiments of the invention have been described in which capacitors provided between power rails and ground have been duplicated and a series connection of a capacitor and a resistor between a circuit and ground have been duplicated. Any number of capacitive connections between a power rail and ground or between a circuit and ground could be duplicated in accordance with the present invention. Moreover, the invention is not limited only to duplicating capacitive and resistive connections. Any impedance (such as capacitive, resistive and/or inductive) between a power rail and ground or between a circuit and ground could be duplicated in accordance with the principles of the present invention.

The embodiments of the invention described above are provided by way of example only. The skilled person will be aware of many modifications, changes and substitutions that could be made without departing from the scope of the present invention. The claims of the present invention are intended to cover all such modifications, changes and substitutions as fall within the spirit and scope of the invention.

Although various embodiments of the present invention have been described and shown, the invention is not restricted thereto, but may also be embodied in other ways within the scope of the subject-matter defined in the following claims.

The invention claimed is:
1. A circuit comprising:
 a first capacitor connected between a first power line and a ground connection;
 a first duplicating capacitor having a capacitance equal to said first capacitor, wherein the first duplicating capacitor is connected between the first power line and a measuring point; and a comparison circuit for comparing the measuring point and the ground connection to determine whether or not a potential difference exists between the measuring point and the ground connection.

2. The circuit as claimed in claim 1, further comprising:
a second capacitor connected between a second power line and the ground connection; and
a second duplicating capacitor having a capacitance equal to said second capacitor, wherein the second duplicating capacitor is connected between the second power line and the measuring point.

3. The circuit as claimed in claim 2, further comprising:
an additional impedance connected between the first power line and the ground connection; and
a duplicating additional impedance having an impedance equal to said additional impedance, wherein the duplicating additional impedance is connected between the first power line and the measuring point.

4. The circuit as claimed in claim 2, further comprising:
a third capacitor connected between a part of the circuit and the ground connection; and
a third duplicating capacitor having a capacitance equal to said third capacitor, wherein the third duplicating capacitor is connected between said part of the circuit and the measuring point.

5. The circuit as claimed in claim 2, wherein a first impedance is connected between a part of the circuit and the ground connection and a duplicating impedance having an impedance equal to said first impedance is connected between said part of the circuit and the measuring point.

6. The circuit as claimed in claim 1, further comprising:
an additional impedance connected between the first power line and the ground connection; and
a duplicating additional impedance having an impedance equal to said additional impedance, wherein the duplicating additional impedance is connected between the first power line and the measuring point.

7. The circuit as claimed in claim 6, further comprising:
a third capacitor connected between a part of the circuit and the ground connection; and
a third duplicating capacitor having a capacitance equal to said third capacitor, wherein the third duplicating capacitor is connected between said part of the circuit and the measuring point.

8. The circuit as claimed in claim 6, wherein a first impedance is connected between a part of the circuit and the ground connection and a duplicating impedance having an impedance equal to said first impedance is connected between said part of the circuit and the measuring point.

9. The circuit as claimed in claim 1, further comprising:
a third capacitor connected between a part of the circuit and the ground connection; and
a third duplicating capacitor having a capacitance equal to said third capacitor, wherein the third duplicating capacitor is connected between said part of the circuit and the measuring point.

10. The circuit as claimed in claim 9, further comprising a first resistor coupled in series with the third capacitor between said part of the circuit and the ground connection and a first duplicating resistor coupled in series with the third duplicating capacitor between said part of the circuit and the measuring point.

11. The circuit as claimed in claim 1, wherein a first impedance is connected between a part of the circuit and the ground connection and a duplicating impedance having an impedance equal to said first impedance is connected between said part of the circuit and the measuring point.

12. The circuit as claimed in claim 1, wherein the circuit is an electromagnetic compatibility filter.

13. The circuit as claimed in claim 1, wherein the comparison circuit comprises a differential amplifier.

14. The circuit as claimed in claim 1, further comprising an output for indicating whether or not the ground connection is properly earthed.

15. A method comprising:
connecting a first capacitor between a ground connection and a first power line;
connecting a first duplicating capacitor between a measuring point and the first power line;
wherein the first capacitor and the first duplicating capacitor have the same capacitance;
comparing the measuring point and the ground connection via a comparator to determine whether or not a potential difference exists between the measuring point and the ground connection; and
providing a signal indicating whether or not a potential difference exists between the measuring point and the ground connection.

16. The method as claimed in claim 15, wherein the signal is used as an output indicating whether or not the ground connection is earthed.

17. The method as claimed in claim 15, wherein a second capacitor is connected between a second power line and the ground connection and a second duplicating capacitor having a capacitance equal to said second capacitor is connected between the second power rail and the measuring point.

18. The method as claimed in claim 15, wherein a first impedance is connected between a part of a circuit and the ground connection and a duplicating impedance having an impedance equal to said first impedance is connected between said part of the circuit and the measuring point.

19. The method as claimed in claim 15, wherein an additional impedance is connected between the first power line and the ground connection and a duplicating additional impedance having an impedance equal to said additional impedance is connected between the first power line and a measuring point.

* * * * *